US005311095A

United States Patent [19]

Smith et al.

[11] Patent Number: 5,311,095

[45] Date of Patent: May 10, 1994

[54] ULTRASONIC TRANSDUCER ARRAY

[75] Inventors: Stephen W. Smith, Durham; Olaf T. von Ramm, Efland; Paul J. Roeder, Pittsboro; Thomas R. Poulin, Cary, all of N.C.

[73] Assignee: Duke University, Durham, N.C.

[21] Appl. No.: 883,006

[22] Filed: May 14, 1992

[51] Int. Cl.$^5$ .............................................. H01L 41/08

[52] U.S. Cl. ..................................... 310/334; 310/336

[58] Field of Search ............... 310/322, 326, 327, 348, 310/334–337; 367/157, 155, 153, 140, 138; 128/660.01, 660.03, 660.07

[56] References Cited

U.S. PATENT DOCUMENTS

| | | | |
|---|---|---|---|
| 4,211,948 | 7/1980 | Smith et al. | 310/326 X |
| 4,217,684 | 8/1980 | Brisken et al. | 310/334 X |
| 4,296,349 | 10/1981 | Nakanishi et al. | 310/335 |
| 4,489,729 | 12/1984 | Sorenson et al. | 128/660 |
| 4,603,276 | 7/1986 | Coursant | 310/368 |
| 4,638,468 | 1/1987 | Francis | 310/334 X |
| 4,747,192 | 5/1988 | Rokusota | 310/334 X |
| 4,755,708 | 7/1988 | Granz et al. | 310/337 |
| 4,773,140 | 9/1988 | McAusland | 310/334 X |
| 4,865,042 | 9/1989 | Umemura et al. | 128/660.03 |
| 4,890,268 | 12/1989 | Smith et al. | 367/138 |
| 4,945,915 | 9/1990 | Nagasaki | 128/660.07 |
| 5,014,711 | 5/1991 | Nagasaki | 128/660.07 |
| 5,045,746 | 9/1991 | Wersing et al. | 310/334 |
| 5,091,893 | 2/1992 | Smith et al. | 310/334 X |

FOREIGN PATENT DOCUMENTS 0355694 2/1990 European Pat. Off. .

OTHER PUBLICATIONS

Erikson, K. R. et al., *Integrated Acoustic Array,* Abstract 1976, pp. 423–445.

Gelly, J. F. et al., *Properties For A 2D Multiplexed Array For Acoustic Imaging,* 1981 Ultrasonics Symposium, pp. 685–689.

Turnbull, Daniel H. et al., *Beam Steering with Pulsed Two-Dimensional Transducer Arrays, IEEE Transactions on Ultrasonics, Ferroelectrics, and Frequency Control,* vol. 38, No. 4, Jul. 1991.

Buchorr, Dr. Leonard S., *Elastomeric Connectors For Land Grid Array Packages, Connection Technology,* Apr. 1989.

Blodgett, Albert J., Jr., *Microelectronic Packaging, Scientific American,* 249(1): 86–96 Jan. 1983.

Fitting, Dale W. et al., *A Two-Dimensional Array Receiver for Reducing Refraction Artifacts in Ultrasonic Computed Tomography of Attenuation, IEEE Transactions on Ultrasonics, Ferroelectrics, and Frequency Control,* vol. UFFC-34, No. 3, May 1987.

Defranould, Ph et al., *Design of a Two Dimensional Array For B and C Ultrasonic Imaging System,* 1977 Ultrasonics Symposium Proceedings, IEEE Cat.

Pappalardo, M., *Hybrid Linear and Matrix Acoustic Arrays, Ultrasonics,* Mar. 1981, pp. 81–86.

Plummer, James D. et al., *Two-Dimensional Transmit/-Receive Ceramic Piezoelectric Arrays:Construction and Performance, IEEE Transactions on Sonics and Ultrasonics,* vol. SU-25, No. 5, Sep. 1978.

*Primary Examiner*—Mark O. Budd

*Attorney, Agent, or Firm*—Bell, Seltzer, Park & Gibson

[57] ABSTRACT

Disclosed is a ultrasonic transducer array comprising a ceramic connector having an array of connector pads, a mismatching layer of electrically conducting material connected to the upper surface of the ceramic connector, a piezoelectric transducer chip connected to the mismatching layer, separation means for dividing the piezoelectric chip into a plurality of transducer elements positioned in a two-dimensional array, wherein each one of the plurality of transducer elements is selectively connected to a corresponding one of the connector pads. Also disclosed in a two-dimensional ultrasound transducer array and transducer array for ultrasound imaging.

15 Claims, 5 Drawing Sheets

ULTRASONIC TRANSDUCER ARRAY

FIELD OF THE INVENTION

The present invention relates to arrays of ultrasonic transducers. More specifically the present invention relates to two-dimensional arrays of piezoelectric transducers for operation at from about 1 MHz and above for biomedical and other related applications.

BACKGROUND OF THE INVENTION

Diagnostic ultrasound is an essential modality in virtually every medical specialty and particularly in obstetrics, cardiology and radiology. The ultrasound transducer is the critical component and the limiting factor affecting the quality of diagnostic ultrasound imaging and Doppler measurements. The most sophisticated medical ultrasound scanners now use (N×1) linear arrays containing over a hundred transducer elements which may be multiplexed and/or electronically steered and focused via phased array techniques.

Two dimensional (N×M) transducer arrays will be essential in future diagnostic ultrasound equipment to improve clinical image quality and Doppler measurements. The most immediate clinical application of 2-D phased arrays is to reduce image slice thickness by focusing in the elevation plane perpendicular to the scanning dimension. The second important application of 2-D transducer arrays is the correction of phase aberrations introduced across the transducer aperture by tissue inhomogeneities. These aberrations occur in two-dimensions so that 2-D arrays combined with the proper phase correction signal processing are essential to restore diagnostic image quality.

In addition to improving conventional ultrasound B-scan image quality, two-dimensional transducer arrays are necessary to develop the new modes of ultrasound imaging anticipated in the near future. These new techniques include (1) presentation of simultaneous orthogonal B-mode scans; (2) acquisition of several B-scans electronically steered in the elevation direction; (3) development of high-speed C-scans; (4) high-speed volumetric ultrasound scanning to enable real time three-dimensional imaging and volumetric, angle-independent flow imaging. These techniques can only be implemented with 2-D array transducers.

It has already been a significant challenge for the ultrasound community to design and fabricate linear phased arrays for medical ultrasound over the past two decades. Three criteria have determined the size and geometry of the transducer array elements. (1) The elements must have sufficient angular sensitivity to steer the phased array over a ±/−45° sector angle. (2) The arrays must suppress grating lobe artifacts by fine inter-element spacing and (3) the width of each rectangular element must be small compared to the transducer thickness to remove parasitic lateral mode vibrations from the desired transducer pass band. These criteria have resulted in long narrow elements in linear arrays such that each element is less than one wavelength wide in tissue (e.g., 0.3mm wide×10 mm long at 3.5 MHz). Unfortunately, the design and fabrication problems of one-dimensional transducer arrays become almost, overwhelming when extended in two dimensions. In this case element sizes may be less than 0.2mm×0.2mm for more than 1000 elements in the array.

There are two obstacles which limit such transducer arrays.

(1) There are severe fabrication difficulties in electrical connection to such array elements which can be less than one ultrasound wavelength on a side.

(2) It is very difficult to achieve adequate sensitivity and bandwidth from such small elements In the last 15 years there have been several descriptions of prototype 2-D array transducers for medical ultrasonic imaging. Some of these prototypes used integrated circuit (IC) fabrication techniques to include a large number of transducer elements, but the resulting product was unsuitable from an acoustic viewpoint. All these prototype arrays were unsuitable for modern medical ultrasound imaging in which the transducer is placed in direct contact with the patient's skin. Erickson et al. (*Acoustical Holography*, Vol. 7, pp 423–425, 1976), describes 8×8 element 2-D array (element size 2mm×2mm) of $L_iNbO_S$ operating at 3MHz on sapphire and silicon substrates with associated integrated circuits with a 0.001 inch high bonding pad for each element. The $L_iNbO_S$/sapphire/silicone structure causes significant problems in acoustic performance. The array was designed only for water tank imaging. Plummer et al. (*IEEE Trans. on Sonics and Ultrasonics*, 50–55, pp. 273–280, 1978), describes the fabrication of 16×16 element 2-D arrays operating at 2–4MHz (element size=2.2mm×2.2mm) of PZT connected by a conductive epoxy bump of unspecified height to a glass substrate with plated through holes on silicon integrated circuits. Again, the PZT/glass/silicon structure will cause significant problems in acoustic performance. Pappalardo (*Ultrasonics*, pp. 81–86, 1981), described a 23×23 element 2-D array operating at 1.6MHz (element size=0.8mm×0.8mm) in which each column of array elements is glued to the edge of a fiber-glass circuit board using conductive epoxy.

Each of these descriptions share the design of a piezoelectric element mounted on a substrate of high acoustic impedance but low acoustic losses. Thus much of the emitted ultrasound energy is emitted from the rear surface of the piezoelectric element and reverberates inside the substrate before transmission into the load (water or tissue). This would result in long pulses of narrow bandwidth, unsuited for high quality medical ultrasound. In each design no attention is paid to the bonding layer thickness whether solder or conductive epoxy.

Another group of 2-D arrays include transducers mounted on lossy acoustic backings to obtain good pulse characteristics but without the advantage of microelectronics fabrication techniques. De Franould et al. (*IEEE Ultrasonics Symposium*, 77CH1264, pp. 251–263, 1977), reported a 2-D array transducer using PZT on a non-conducting plexiglass λ/4 mismatching layer and a lossy tungsten-epoxy backing (0.4mm×4mm elements at 2.4MHz). No connection technique was specified. Fitting et al. (*IEEE Trans. on Ultrasonic Farro. and Freq. Control*, UFFC-34, pp. 346–356, 1987), described a 2-D array transducer for receive mode only using mask metallization of polyvinylidene fluoride on a tungsten epoxy substrate. However, none of these involved the use of multi-layer ceramic technology. Nakashani et al. (U.S. Pat. No. 4,296,349) discussed a conductive mismatching layer of thicknesses of λ/32 to 3λ/16, however, this work involved low acoustic impedance transducer material (polymer) rather than the high acoustic impedance of PZT.

SUMMARY OF THE INVENTION

The present invention utilizes acoustic matching techniques and multi-layer ceramic fabrication technology to provide a two-dimensional array ultrasonic transducer having transducer elements of less than one wavelength on a side and having sufficient sensitivity and width for high resolution medical imaging.

The present invention provides an ultrasonic transducer array comprising a ceramic connector having an upper surface, a lower surface and an array of connector pads formed in the ceramic connector for electrically connecting the upper surface to the lower surface, a mismatching layer of electrically conducting material connected to the upper surface of the ceramic connector, a piezoelectric transducer chip having an upper surface and a lower surface, wherein the lower surface of the piezoelectric chip is connected to the mismatching layer, and separation means for dividing the piezoelectric chip into a plurality of transducer elements, wherein each one of the plurality of transducer elements is selectively connected to a corresponding one of the connector pads.

In a more particular embodiment of the present invention, the two-dimensional array ultrasonic transducer comprises a ceramic connector having an upper surface, a lower surface and an array of connector pads formed in the ceramic connector for electrically connecting the upper surface to the lower surface, a mismatching layer of electrically conducting material connected to the upper surface of the ceramic connector, a piezoelectric transducer chip having an upper surface and a lower surface wherein the lower surface of the piezoelectric chip is connected to the mismatching layer, slot means extending downward from the upper surface of the piezoelectric chip into the ceramic connector for dividing the piezoelectric chip, mismatching layer and ceramic connector into a plurality of transducer elements positioned in a two-dimensional array, wherein each one of the plurality of transducer elements is electrically connected to a corresponding one of the connector pads, an uppermost layer of electrically conducting foil connected to the upper surface of the piezoelectric chip, and redistribution means for redistributing the position of electrical connections for the array of transducer elements to increase the distance between electrical connections to a distance greater than that between individual connector pads of the array of connector pads.

It is a further aspect of the present invention to provide a two-dimensional array ultrasonic transducer which is suitable for use in ultrasonic imaging for both three dimensional imaging and thin slice imaging. These and other aspects of the present invention are discussed in detail below.

DETAILED DESCRIPTION OF THE PREFERRED EMBODIMENTS

The current invention solves both of the developmental problems of 2-D arrays. The invention combines the fabrication advantages of multi-layer ceramic connection (MLC) technology with the acoustic advantages of a low impedance conductive mismatching layer inserted between the piezoelectric element and the high acoustic impedance substrate of the MLC connector. The multi-layer ceramic connector consists of many thick films of ceramic (e.g., alumina) and metallization with customized interconnections between the layers called "vias".

Figure 1:
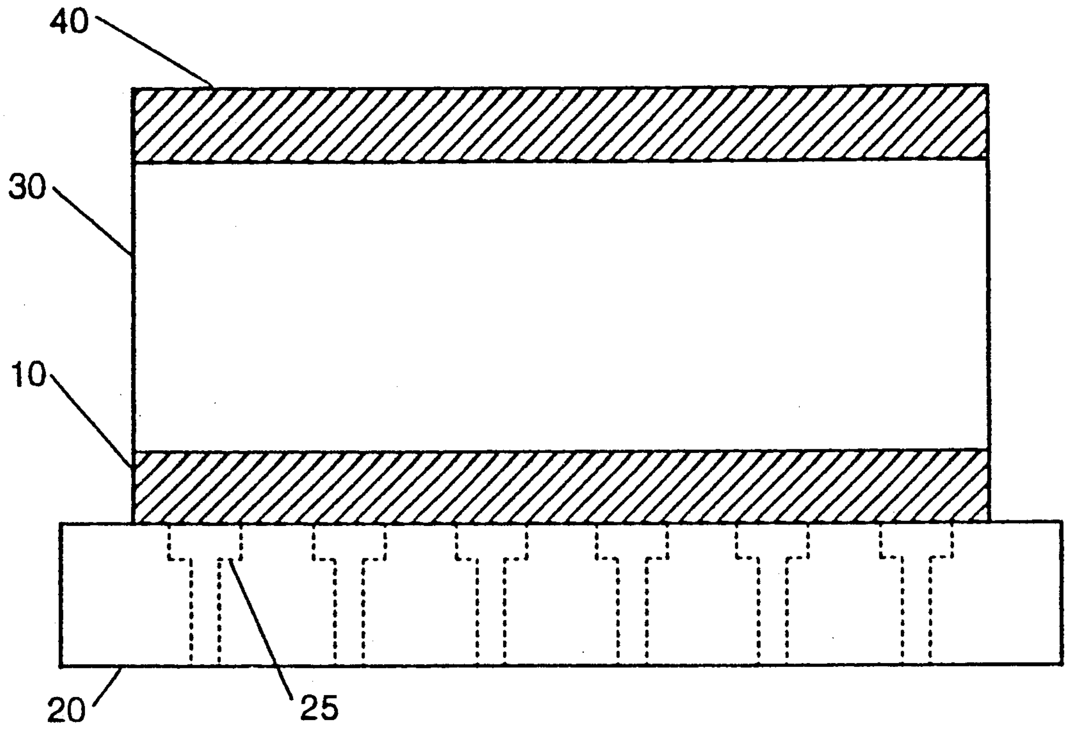
FIG. 1 is a cross sectional view of one embodiment of the present invention prior to the formation of the array of transducer elements.

FIG. 1 illustrates one embodiment of the present invention prior to the formation of the array of transducer elements. As seen in FIG. 1, a layer of electrically conductive material 10 is connected to the upper surface of a ceramic connector 20. The ceramic connector 20 includes connection pads 25 which provide an electrical connection from the upper surface of the ceramic connector to the lower surface of the connector. The ceramic connector 20 has one connection pad 25 for each transducer element.

A piezoelectric chip 30 is connected to the electrically conductive layer 10. Chips of known piezoeleotric transducer materials of high acoustic impedance are suitable for use in the present invention, however lead zircanate titanate (PZT) is preferred. The lower surface of the piezoelectric chip 30 is connected to the upper surface of the electrically conductive layer 10, hereinafter referred to as the mismatching layer. The mismatching layer 10 provides an electrical connection between the piezoelectric chip 30 and the ceramic connector 20. The mismatching layer 10 also provides the mechanical connection between the piezoelectric chip 30 and the ceramic connector 20. The thickness of the layer 10 is preferably about one fourth the wavelength ($\lambda/4$) of the frequency of operation of the transducer and is referred to as the $\lambda/4$ mismatching layer. However, thicknesses of less than one quarter wavelength or multiples of one quarter wavelength may be used. The mismatching layer 10 is preferably made of silver epoxy or other conductive materials such as polymer or silicone anisotropic connector layers known as elastomeric connectors. The conductive epoxy $\lambda/4$ mismatching layer serves not only to bond the piezoelectric element to the pad of the ceramic connector but also to prevent acoustic transmission into the ceramic backing. As an example, for conductive epoxy $Z_1=5$ M Rayls and for alumina MLC substrate $Z_2=30$ M Rayls, a $\lambda/4$ conductive epoxy layer yields an effected backing impedance of $Z_1=Z_1^2/Z_2=0.8$ M Rayls. Further alternatives for the composition of the mismatching layer 10 are low acoustic impedance, electrically conductive aerogel, carbon and conductive polyimide. These materials exhibit lower acoustic impedance and further reduce transmission to the ceramic substrate below the 2-D array. These materials also provide electrical connection between the piezoelectric element and MLC pad by mechanical compression or by use of thin layers of conductive epoxy.

As shown in FIG. 1, an optional second electrically conductive layer 40, which is referred to as the matching layer, may be connected to the upper surface of the piezoelectric chip 30. Like the mismatching layer, the thickness of the matching layer is preferably one fourth the wavelength (λ/4) of the frequency of operation of the transducer and is referred to as the λ/4 matching layer. The matching layer 40 may be made of the same materials as the mismatching layer 10. The use of a matching layer enhances transmission of the acoustic signal to and from the region under test.

Figure 2:
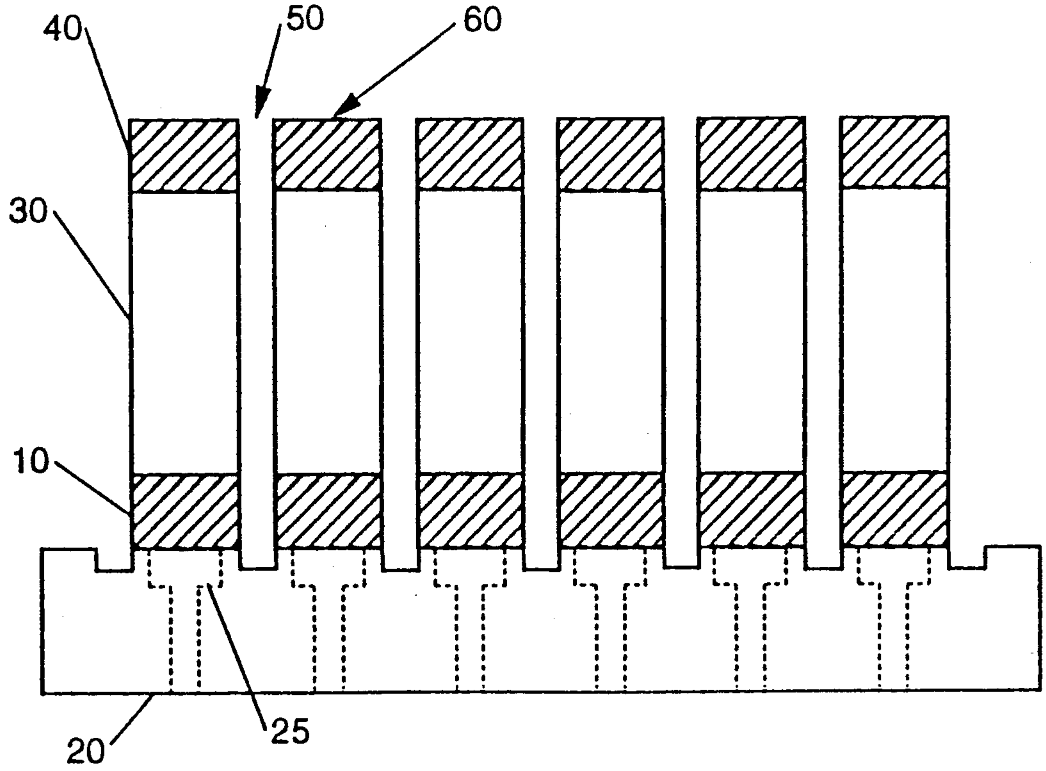
FIG. 2 is a cross sectional view of one embodiment of the present invention after the formation of the array of transducer elements.

As seen in FIG. 2, slots 50 are formed in the structure of FIG. 1 extending downward from the upper surface of the matching layer 40, if present, or the upper surface of the piezoelectric chip 30 if the matching layer 40 is not present. The slots 50 extend through the piezoelectric chip 30 and the mismatching layer 10 and into the ceramic connector 20. The slots 50 extend into the ceramic connector 20 to prevent inter-element acoustic cross talk in the ceramic connector. The slots 50 may be a groove or a plurality of grooves and may be filled with materials such as glass balloons or foam but are preferably void. The slots 50, provide separation means for dividing the matching layer 40, the piezoelectric chip 30, the mismatching layer 10 and the ceramic connector 20 into a plurality of transducer elements 60 which may be positioned in a two-dimensional (M×N) array or a linear (M×I) array. The transducer elements 60 are positioned such that electrical connection is selectively made to one of the connector pads 25 of the ceramic connector 20 thereby allowing for electrical connection to each of the transducer elements 60 to be used through the ceramic connector 25. As will be apparent to one of skill in the art, other means for dividing the piezoelectric chip into transducer elements may be utilized such as the division of the piezoelectric chip through selective placement of electrodes in contact with the piezoelectric chip thereby eliminating the need for slots to divide the piezoelectric chip.

Figure 3:
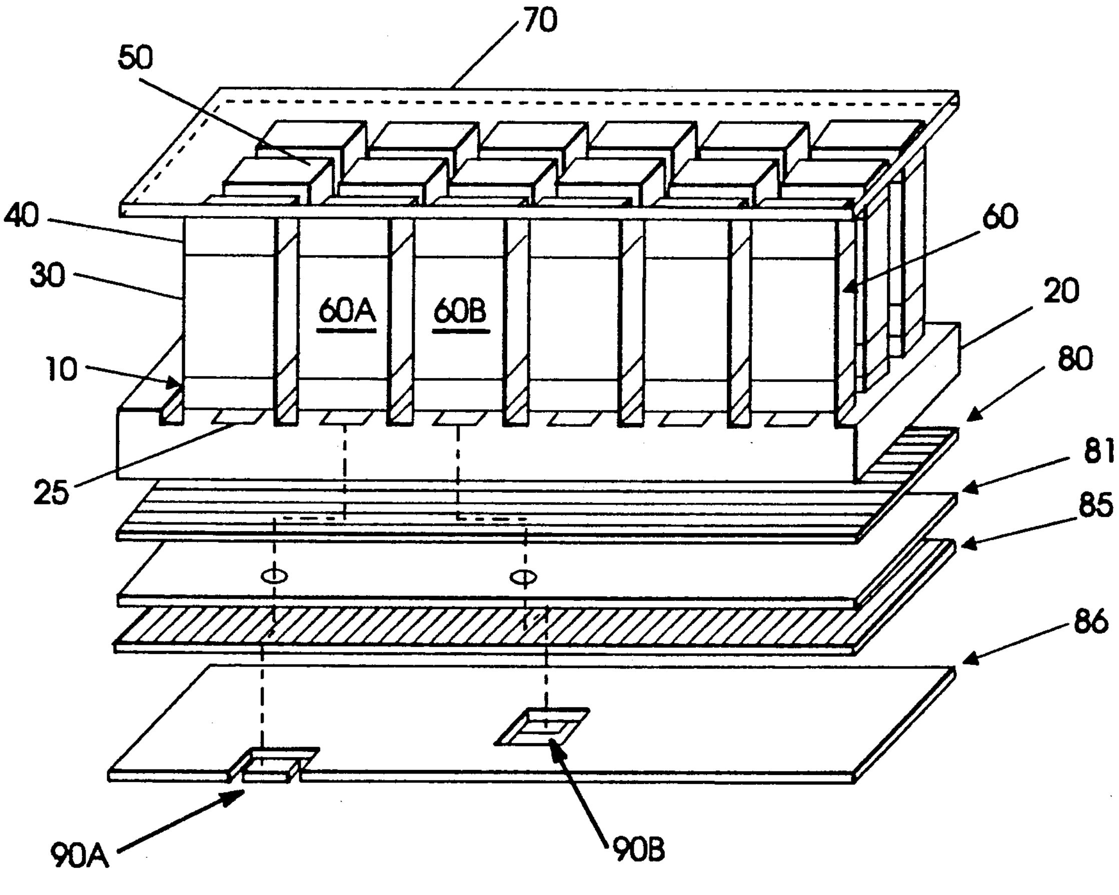
FIG. 3 is an orthogonal view of one embodiment of the present invention.

An orthogonal view of the present invention is shown in FIG. 3. As seen in FIG. 3, a conductive foil 70 such as gold coated mylar or silver foil is connected to the upper surface of the divided piezoelectric chip 30 or the matching layer 40 if present. The conductive foil 70 serves as the ground plane.

The structures of the present invention may be produced using any number of methods of bonding and dicing techniques. One such method is to deposit a thick film of conductive epoxy onto the piezoelectric chip utilizing standard thick film deposition techniques such as that employed by the Presco Model 462 Thick Film Screen Printer. The thickness of the conductive epoxy deposition is selected to produce the λ/4 mismatching layer 10 described above. The thickness of the conductive epoxy and piezoelectric chip may then be established by removing conductive epoxy until the desired dimension is achieved. Where thinner films of conductive epoxy are required a lapping wheel may be employed to reduce the thickness of the epoxy for precise adjustment of the thickness. Reactive plasma etching of all components may be employed to remove organic contaminants and oxidation and to leave a layer of surface ions to enhance bonding In an alternate technique for very high frequencies, the piezoelectric chip and mismatching layer may then be deposited on the ceramic connector utilizing vacuum deposition, spin deposition, so-gel or other thin film deposition techniques. The piezoelectric chip 30 is then mounted to the ceramic connector 20 using more conductive epoxy to bond the chip 30 to the connector 20. A second optional piezoelectric chip 30 to produce the λ/4 matching layer 40. This structure is then diced to produce the slots which divide the structure into a plurality of transducer elements. This dicing operation may carried out using K & S Diamond Wheel Dicing Saw which produces kurf widths about 25 microns. The size and shape of the transducer elements is determined by the dicing pattern and is typically a square or checkerboard pattern however other patterns such as parallelograms, circles and rhombuses may be used depending upon the specific application of the transducer array. The actual configuration of the transducer array, however, may be selected by selectively establishing electrical connections to specific transducer elements in the checkerboard, by selective placement of connector pads or vias or by other electrical means. Active transducers may be configured by virtue of said selective connections in any number of predetermined patterns such as a cross, a filled or unfilled rectangle or a filled or unfilled circle. Note that through selection of active transducer elements, the patterns for the send transducers may be the same or different from the pattern for the receive transducers. The conductive foil 70 is then bonded to the piezoelectric chip 30 or the conductive epoxy of the matching layer 40 as a bonding agent.

Optionally, and as shown in FIG. 3, the two-dimensional array ultrasonic transducer of the present invention may have means for redistributing the electrical connections of the connection pads 25 of the ceramic connector 20 so as to increase the distance between electrical connections to a greater distance than that between individual connector pads 25. This increase in spacing between electrical connections allows for simpler connection to external electronics such as voltage sources and input amplifiers. The increased spacing allows for the use of coaxial connections between the transducer array and the external electronics which results in reduced noise in the electrical output from the transducer and thereby increases the usable sensitivity of the transducer array. The increased spacing is accomplished through the use of multi-layer ceramic technology. Beneath each connection pad 25 on the ceramic connector 25, a metallized via descends vertically to the first and second redistribution layers, 80 and 85 respectively, in order to expand the distance between transducer array elements to the desired distances between the connector output pads 90. As illustrated in FIG. 3, transducer elements 60A and 60B are separated by 0.2mm. A via, 0.1mm in diameter, descends from transducer element 60A to the first redistribution layer 80 where a printed conductor takes a path in a first direction, (for example left) to a second via which descends through a conductive layer 81, which acts as a ground plane, to the second redistribution plane where a conductor moves in a second direction transverse to the first direction (for example forward as shown in FIG. 3) to a third via which descends through a second conductive layer 86, which also acts as a ground plane, to the output pad 90A. Meanwhile, beneath transducer element 60B, a via descends to the first redistribution layer 80, moves in a first direction to a new via which descends through conductive layer 81 to the second redistribution layer 85 to move in a second direction transverse to the first direction to a new via which descends through conductive layer 86 to the output pad 90B. This design is repeated for each of the transducer array elements and can be used to expand for example, the 0.2mm inter-element spacing to a 0.5mm spacing typical of output pad for conventional connection to coaxial cables. For complex 2-D transducer array patterns, it is necessary to use several redistribution layers to avoid crossing conductors. To reduce electrical cross-talk between the vias, ground planes are included between each redistribution layer.

Fabrication of the redistribution and ceramic connector may be accomplished as follows using procedures known to one of skill in the art. A mixture of an organic binder and ceramic powder (e.g. alumina) is spread to form a thin layer and heated to form what is known as "green tape". Multiple holes are punched (mechanically or by laser) or etched into the tape to form the vias. The via holes are filled with a metal paste (e.g. silver) and metallic traces are laid down by screen printing on the first and second redistribution layers. Multiple layers of green tape are then superimposed to align the vias, the multi-layer sandwich is laminated and then finally sintered to form a single package. Silver is then plated or vacuum deposited on the input pads and gold pins are brazed on the output contacts.

Figure 4:
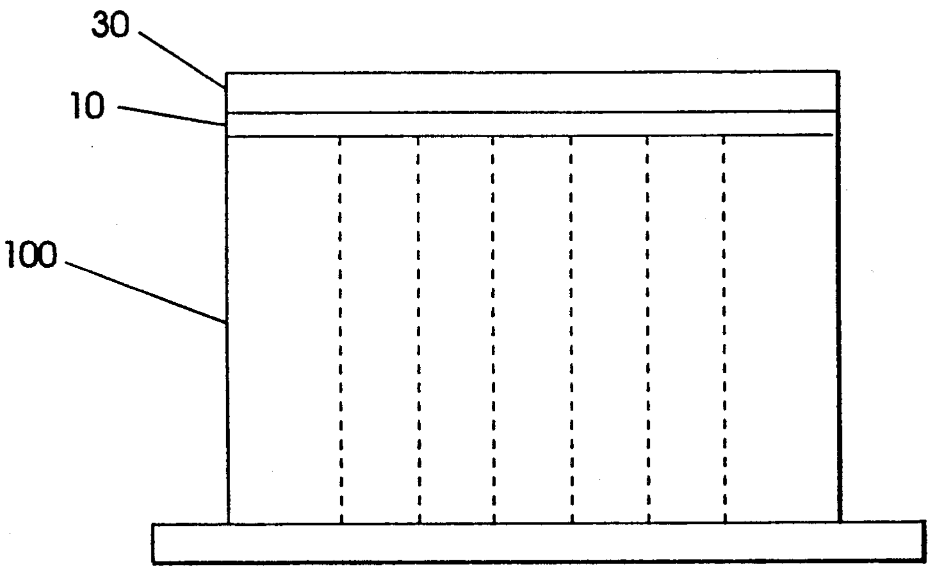
FIG. 4 is a cross sectional view of another embodiment of the present invention.

FIG. 4 shows an alternate embodiment of the present invention which includes a stand-off 100 to allow improved use of the present invention for medical imaging applications by allowing improved contact with the skin surface of a patient for small acoustic windows on the body such as the inter-costal space between the ribs for cardiac ultrasound diagnosis. This stand-off may be fabricated using conventional multi-layer ceramic technology.

Figure 5:
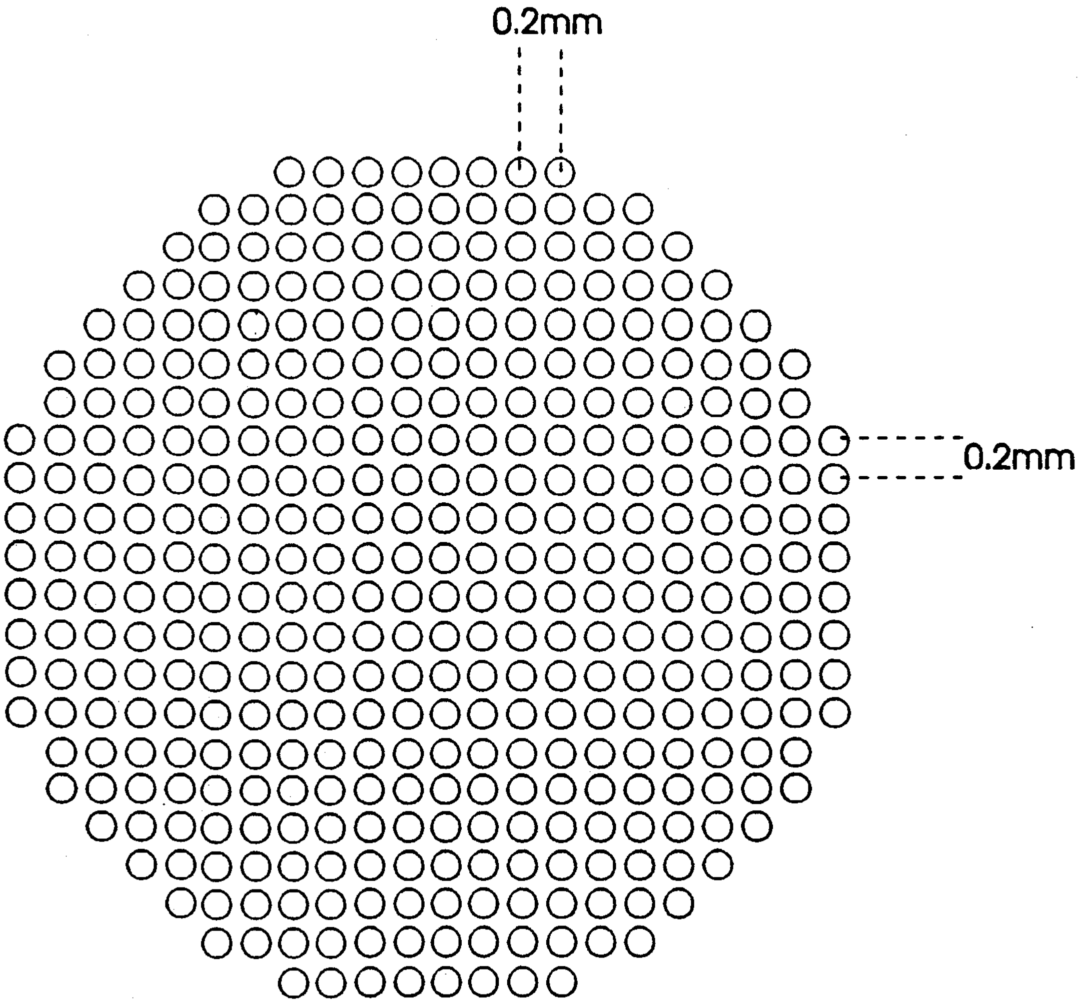
FIG. 5 is a top view of the transducer array of one embodiment of the present invention.
Figure 6:
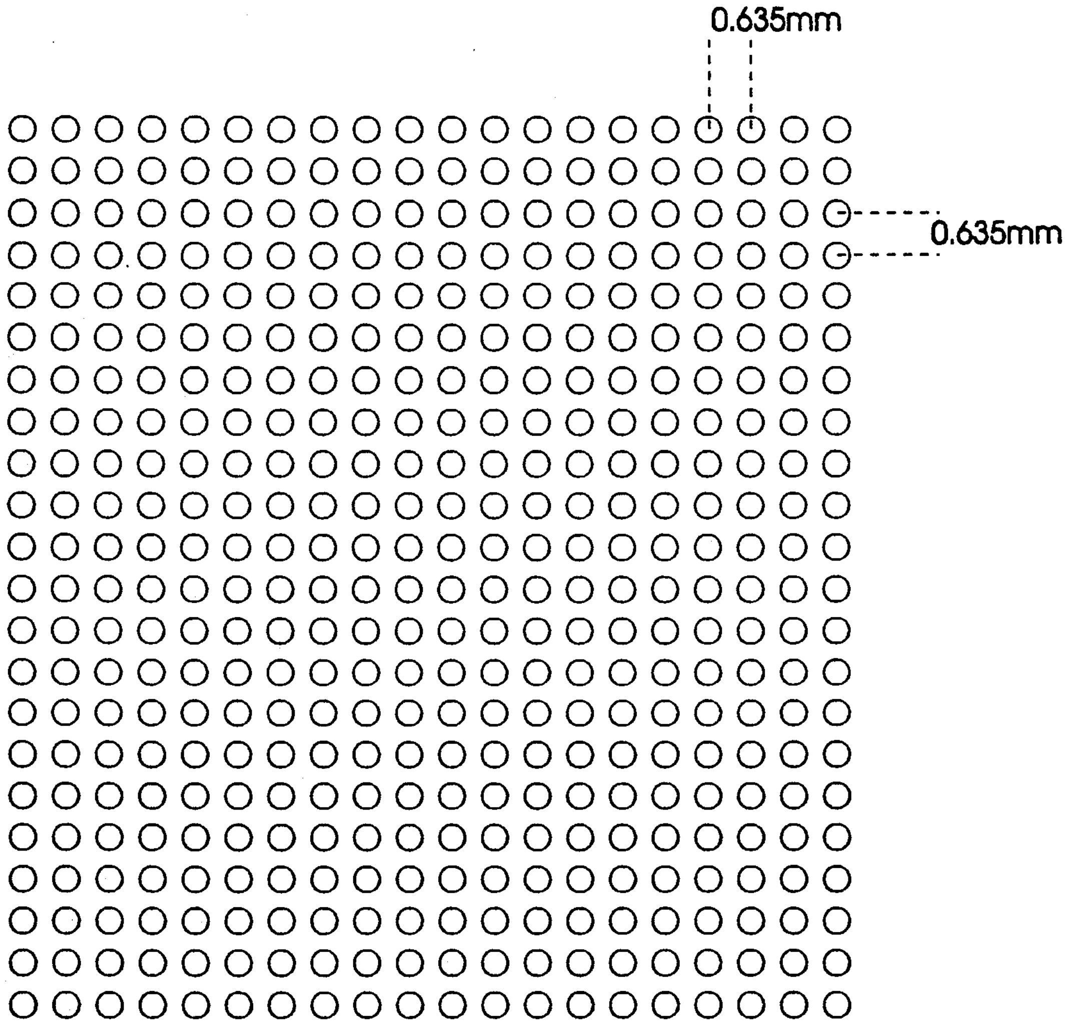
FIG. 6 is the corresponding bottom view of FIG. 5.

The two dimensional array ultrasonic transducer of the present invention may also be incorporated into a handle for easier use in medical and other applications. An example of the top view of the transducer is shown in FIG. 5, in which the interelement transducer spacing is 0.2mm so that the total footprint on the skin surface is only a 5m×5mm square. FIG. 6 shows the bottom view of the transducer of FIG. 5 and shows a flange containing a pad array for connection to an optional transducer handle. The inter-element spacing of the pads is 0.635mm so that a redistribution, or fan-out, occurs in the MLC connector enabling easier electrica connection to the cables of the transducer handle.

Uses for the present invention include three dimensional ultrasound imaging or volumetric measurements and thin slice ultrasound imaging. In use, the transducer elements of the two-dimensional array ultrasonic transducer are excited by a voltage source in electrical connection with the transducer elements through the ceramic connector. The electrical voltage source places an electrical voltage across the element to produce an ultrasonic output from the element. These voltages typically range from about 50 volts to about 300 volts. The voltage excites the transducer element to produce an ultrasonic signal which is transmitted from the transducer array into a test region. When receiving ultrasonic signals, the ultrasonic signal excites a transducer element to produce an electrical voltage across the transducer element. This electrical voltage is the amplified by an amplifier in electrical connection with the transducer element through the ceramic connector. A further advantage of the present invention is the ability to use what is known in the art as "cavity down" positioning of integrated circuit with the multi-layer ceramic connector to provide amplifiers for receive and transmit mode use of the transducers in a single integrated package. Using the "cavity down" method, an integrated circuit is mounted directly onto the connection side of the multi-layer ceramic connector thereby incorporating the integrated circuit as part of the transducer array assembly and allowing for the integration of the circuitry into the handle of the transducer array to provide a more compact unit.

The present invention may be used over a wide range of operating frequencies of from about 1 MHz to about 10 MHz and above. Variations in the physical thickness of the mismatching and matching layers will be required based on the desired operating frequency of the device with the thickness being proportional to the wavelength of the operating frequency as described above. The physical dimensions and number of elements in the two-dimensional array will depend upon the application of the transducer array. For example, a square array of square transducer elements can be utilized for three dimensional imaging systems. Square transducer elements of from about 0.1 mm to about 1 mm are suitable for three dimensional imaging using frequencies of from about 10 MHz to about 1 MHz. However, as smaller dimensions are utilized, operating frequencies of greater than 10 MHz may be achieved. The depth of the slots described above determines the height of the piezoelectric chip and other layers and is typically from about 0.1 mm to about 1 mm.

For applications of thin slice imaging, a rectangular array of rectangular transducer elements is advantageous. For example, a 4×32 element array of rectangular transducer elements may be used. Rectangular elements having a width of from about 0.1 mm to about 1 mm and a length of from about 2 mm to about 20 mm is preferred. As described herein, the width of the transducer elements is that dimension of the elements parallel to the axis of the array having the larger number of transducer elements and the length is that dimension of the transducer elements which is parallel to the dimension of the transducer array having the smaller number of elements.

The foregoing is illustrative of the present invention, and not to be construed as limiting thereof. For example, other methods of fabrication of the present invention may be utilized while still benefiting from the teachings of the present invention. Those skilled in the art will also appreciate that other methods of increasing the distance between electrical connections to the transducer elements of the present invention may be utilized. The invention is accordingly defined by the following claims, with equivalents of the claims to be included therein.

That which is claimed is:

1. A two-dimensional array ultrasonic transducer for ultrasonic imaging comprising:
   - a ceramic connector having an upper surface, a lower surface and an array of connector pads formed in said ceramic connector for electrically connecting said upper surface to said lower surface;
   - a mismatching layer of electrically conducting material connected to said upper surface of said ceramic connector;
   - a piezoelectric transducer chip connected to said mismatching layer;
   - a matching layer of electrically conducting material having an upper surface and a lower surface wherein said lower surface of said matching layer connected to said piezoelectric chip;
   - slot means extending downward from said upper surface of said matching layer into said ceramic connector for dividing said matching layer, piezoelectric chip, mismatching layer and ceramic connector into a plurality of transducer elements of from about 0.1 mm to about 1 mm in width, from about 0.1 mm to about 20 mm in length and from about 0.1 mm to about 1 mm in height, said transducer elements being positioned in a two-dimensional array wherein each one of said plurality of transducer elements is electrically connected to a corresponding one of said connector pads;

an uppermost layer of electrically conducting foil connected to said upper surface of said matching layer;

redistribution means for redistributing the position of electrical connections for said array of transducer elements to increase the distance between electrical connections to a distance greater than that between individual connector pads of said array of connector pads; and voltage source means connected to said redistribution means for electrically exciting said array of transducer elements to produce an ultrasonic pulse of from about 1 to about 10 MHz.

2. The two-dimensional array ultrasonic transducer of claim 1 wherein said slot means comprises a groove.

3. The two-dimensional array ultrasonic transducer of claim 1 wherein said slot means comprises a plurality of grooves.

4. The two-dimensional array ultrasonic transducer of claim 1 wherein said slot means comprises a plurality of grooves filled with materials selected from the group consisting of glass balloons and polymer foam.

5. The two-dimensional array ultrasonic transducer of claim 1 wherein said array of transducer elements is a rectangular array of transducer elements and wherein said transducer element array is configured by selecting elements from said rectangular array of transducer elements.

6. The two-dimensional array ultrasonic transducer of claim 1 further comprising a stand-off to improve the contact of the said ultrasonic transducer with the subject of the irradiation.

7. The two-dimensional array ultrasonic transducer of claim 1 wherein said matching and said mismatching layers are silver epoxy.

8. The two-dimensional array ultrasonic transducer of claim 1 wherein said redistribution means comprises:

a first ceramic redistribution layer having conducting strips electrically connected to said connector pads and extending in a first direction, said first redistribution layer having an upper surface and a lower surface wherein said upper surface of said first redistribution layer is adjacent said lower surface of said ceramic connector;

a first conductive layer having an upper surface and a lower surface wherein said upper surface of said first conductive layer is adjacent said lower surface of said first redistribution layer;

a second ceramic redistribution layer having conducting strips extending in a second direction transverse to said first direction, said second redistribution layer having an upper surface and a lower surface wherein said upper surface of said second redistribution layer is adjacent said lower surface of said first conductive layer;

vias formed in said first conductive layer to electrically connect said first redistribution layer to said second redistribution layer; and a second conductive layer having an upper surface and a lower surface wherein said upper surface of said second conductive layer is adjacent said lower surface of said second redistribution layer, said second conductive layer having vias formed therein to provide output pads for said two-dimensional array ultrasonic transducer.

9. The two-dimensional array ultrasonic transducer of claim 1 further comprising amplifier means for receiving electrical signals from said array of transducer elements.

10. The two-dimensional array ultrasonic transducer of claim 1 further comprising a handle.

11. The two dimensional array ultrasonic transducer of claim 1 wherein said piezoelectric chip is a PZT chip.

12. A two dimensional array ultrasonic transducer of claim 1, further comprising an integrated circuit mounted on said ceramic connector and in electrical connection with said transducer elements.

13. The two dimensional array ultrasonic transducer of claim 12 wherein said integrated circuit is comprised of a plurality of amplifiers.

14. An ultrasonic transducer array comprising:

a ceramic connector having an upper surface, a lower surface and an array of connector pads formed in said ceramic connector for electrically connecting said upper surface to said lower surface;

a mismatching layer of electrically conducting material connected to said upper surface of said ceramic connector;

a piezoelectric transducer chip having an upper surface and a lower surface, wherein the lower surface of said piezoelectric chip is connected to said mismatching layer;

separation means for dividing said piezoelectric chip into a plurality of transducer elements, wherein each one of said plurality of transducer elements is selectively connected to a corresponding one of said connector pads;

a first ceramic redistribution layer having conducting strips electrically connected to said connector pads and extending in a first direction, said first redistribution layer having an upper surface and a lower surface wherein said upper surface of said first redistribution layer is adjacent said lower surface of said ceramic connector;

a first conductive layer having an upper surface and a lower surface wherein said upper surface of said first conductive layer is adjacent said lower surface of said first redistribution layer;

a second ceramic redistribution layer having conducting strips extending in a second direction transverse to said first direction, said second redistribution layer having an upper surface and a lower surface wherein said upper surface of said second redistribution layer is adjacent said lower surface of said first conductive layer;

vias formed in said first conductive layer to electrically connect said first redistribution layer to said second redistribution layer; and a second conductive layer having an upper surface and a lower surface wherein said upper surface of said second conductive layer is adjacent said lower surface of said second redistribution layer, said second conductive layer having vias formed therein to provide output pads for said two-dimensional array ultrasonic transducer.

15. A two-dimensional array ultrasonic transducer comprising:

a ceramic connector having an upper surface, a lower surface and an array of connector pads formed in said ceramic connector for electrically connecting said upper surface to said lower surface;

a mismatching layer of electrically conducting material connected to said upper surface of said ceramic connector;

a piezoelectric transducer chip having an upper surface and a lower surface wherein the said lower surface of said piezoelectric chip is connected to said mismatching layer;

slot means extending downward from said upper surface of said piezoelectric chip into said ceramic connector for dividing said piezoelectric chip, mismatching layer and ceramic connector into a plurality of transducer elements positioned in a two-dimensional array, wherein each one of said plurality of transducer elements is electrically connected to a corresponding one of said connector pads;

an uppermost layer of electrically conducting foil connected to said upper surface of said piezoelectric chip;

a first ceramic redistribution layer having conducting strips electrically connected to said connector pads and extending in a first direction, said first redistribution layer having an upper surface and a lower surface wherein said upper surface of said first redistribution layer is adjacent said lower surface of said ceramic connector;

a first conductive layer having an upper surface and a lower surface wherein said upper surface of said first conductive layer is adjacent said lower surface of said first redistribution layer;

a second ceramic redistribution layer having conducting strips extending in a second direction transverse to said first direction, said second redistribution layer having an upper surface and a lower surface wherein said upper surface of said second redistribution layer is adjacent said lower surface of said first conductive layer;

vias formed in said first conductive layer to electrically connect said first redistribution layer to said second redistribution layer;

a second conductive layer having an upper surface and a lower surface wherein said upper surface of said second conductive layer is adjacent said lower surface of said second redistribution layer, said second conductive layer having vias formed therein to provide output pads for said two-dimensional array ultrasonic transducer.

* * * * *